US007663409B2

(12) United States Patent
Singnurkar

(10) Patent No.: US 7,663,409 B2
(45) Date of Patent: Feb. 16, 2010

(54) VOLTAGE/CURRENT CONVERTER CIRCUIT AND METHOD FOR PROVIDING A RAMP CURRENT

(75) Inventor: Pramod Singnurkar, Graz (AT)

(73) Assignee: Austriamicrosystems AG, Unterpremstatten (AT)

( * ) Notice: Subject to any disclaimer, the term of this patent is extended or adjusted under 35 U.S.C. 154(b) by 0 days.

(21) Appl. No.: 11/828,168

(22) Filed: Jul. 25, 2007

(65) Prior Publication Data

US 2008/0048738 A1 Feb. 28, 2008

(30) Foreign Application Priority Data

Jul. 26, 2006 (EP) .................................. 06015605

(51) Int. Cl.
*H02M 11/00* (2006.01)
*H03F 3/45* (2006.01)

(52) U.S. Cl. ...................................... 327/103; 323/313

(58) Field of Classification Search ................ 327/103; 323/313

See application file for complete search history.

(56) References Cited

U.S. PATENT DOCUMENTS

| | | | | |
|---|---|---|---|---|
| 4,427,903 | A * | 1/1984 | Sugimoto | 327/103 |
| 4,562,408 | A | 12/1985 | Nagai et al. | |
| 4,675,594 | A * | 6/1987 | Reinke | 323/317 |
| 4,931,718 | A * | 6/1990 | Zitta | 323/313 |
| 5,212,458 | A | 5/1993 | Fitzpatrick et al. | |
| 5,502,410 | A * | 3/1996 | Dunn et al. | 327/140 |
| 5,963,085 | A | 10/1999 | Sauer | |
| 5,973,561 | A | 10/1999 | Heaton | |
| 6,525,607 | B1 | 2/2003 | Liu | |
| 6,586,980 | B1 | 7/2003 | Callahan, Jr. | |
| 6,747,514 | B1 | 6/2004 | Aude | |
| 6,768,371 | B1 | 7/2004 | Layton et al. | |
| 7,196,555 | B2 * | 3/2007 | Taylor | 327/103 |
| 2004/0017504 | A1 | 1/2004 | Prandoni et al. | |
| 2004/0113696 | A1 | 6/2004 | Forejt et al. | |
| 2006/0017504 | A1 | 1/2006 | Deval et al. | |

FOREIGN PATENT DOCUMENTS

| | | |
|---|---|---|
| DE | 3345045 | 6/1984 |
| EP | 0715239 A1 | 5/1996 |

(Continued)

OTHER PUBLICATIONS

Leung, C.Y. et al. "A 1-V Integrated Current-Mode Boost Converter in Standard 3.3/5-V CMOS Technologies", IEEE Journal of Solid-State Circuits, vol. 40, No. 11, Nov. 2005, pp. 2265-2274.

(Continued)

*Primary Examiner*—Lincoln Donovan
*Assistant Examiner*—John W Poos
(74) *Attorney, Agent, or Firm*—Fish & Richardson P.C.

(57) ABSTRACT

A voltage/current converter circuit includes a bridge configuration having a first current path with a first resistor, a first transistor, and an input node to receive a ramp voltage to be converted, and a second current path with a second resistor and a second transistor. A current passes through the second current path. An amplifier arrangement balances the bridge configuration by providing an output signal to a control terminal of the first transistor and/or to a control terminal of the second transistor.

20 Claims, 4 Drawing Sheets

FOREIGN PATENT DOCUMENTS

| | | |
|---|---|---|
| EP | 1884856 | 2/2008 |
| EP | 1885061 | 2/2008 |
| EP | 1921747 | 5/2008 |
| WO | WO2008/012334 | 1/2008 |

OTHER PUBLICATIONS

Leung et al., "An Integrated CMOS Current-Sensing Circuit for Low-Voltage Current-Mode Buck Regulator", IEEE Transactions on Circuits and Systems-II: Express Briefs, vol. 52(7), pp. 394-397 (Jul. 2005).

Binkley et al., "Micropower, 0.35nm/m partially depleted SOI CMOS preamplifiers having low white and flicker noise", IEEE Intl. SOI Conf. Proc. (Sep. 29, 2003), pp. 85-86, #XP010666037.

Fukumoto et al., "Optimizing Bias-Circuit Design of Cascode Operational Amplifier for Wide Dynamic Range Operations", Proc. Of the 2001 Intl Symposium on Low Power Electronics and Design (ISPLED), ACM (Aug. 6, 2001), #XP001134627.

Wang et al., "A 3-V High-Bandwidth Integrator for Magnetic Disk read Channel Continuous-Time Filtering Applications", Custom Integrated Circuits Conf., Proc. Of the IEEE 1998, pp. 427-430, #XP010293893 (May 1998).

Rincon-Mora et al., "Accurate and Lossless Current-Sensing Techniques for Power Applications - A Practical Myth?", Power Management Design Line, dated Mar. 16, 2005.

International Search Report in Application No. PCT/EP2007/057685, dated Nov. 28, 2007.

International Preliminary Report on Patentability in Application No. PCT/EP2007/057685 (including Written Opinion), dated Jan. 27, 2009.

U.S. National Phase U.S. Appl. No. 12/375,198, retrieved from PAIR on Aug. 28, 2009.

* cited by examiner

VOLTAGE/CURRENT CONVERTER CIRCUIT AND METHOD FOR PROVIDING A RAMP CURRENT

CLAIM TO PRIORITY

This patent application claims priority to European Patent Application No. 06015605.6, which was filed on Jul. 26, 2006. The contents of European Patent Application No. 06015605.6 are hereby incorporated by reference into this patent application as if set forth herein in full.

TECHNICAL FIELD

This patent application relates to a voltage/current converter circuit, a ramp generator circuit comprising a voltage/current converter circuit, and a method for providing a ramp current.

BACKGROUND

Voltage/current converter circuits are common in consumer and industrial electronics. They are used in direct current/direct current (DC/DC) converters and abbreviated DC/DC converters, which up- or down-convert a supply voltage to generate an output voltage for electrical circuits. DC/DC converters are often implemented as switch mode converters.

SUMMARY

Voltages in a ramp form are generated by charging a capacitor with a current. Such a ramp voltage can be used for generating a clock signal which controls a switch mode converter.

In an embodiment, a voltage/current converter circuit comprises a bridge configuration. The bridge configuration comprises a first and a second current path and an amplifier arrangement. The first current path comprises a first resistor, a first transistor, and an input node. The input node is arranged between the first resistor and the first transistor. The second current path comprises a second resistor and a second transistor. An output terminal of the amplifier arrangement is coupled to a control terminal of the first transistor and/or of the second transistor.

A ramp voltage is received at the input node of the first current path for conversion. The amplifier arrangement balances the bridge configuration by applying an output signal to a control terminal of the first transistor and/or to a control terminal of the second transistor. A converted current flows through the second transistor.

It is an advantage of the bridge configuration that a current flowing through the first current path is dependent on the ramp voltage applied to the input node, and that a converted current flowing through the second current path is a mirror of the current flowing through the first current path.

In an embodiment, the bridge configuration is implemented as a Wheatstone bridge.

In an embodiment, the amplifier arrangement has a first and a second input terminal. The first input terminal is coupled to the first current path and the second input terminal is coupled to the second current path.

In an embodiment, the first transistor couples the input node to a first power supply terminal. The first resistor couples the first input terminal of the amplifier arrangement to a second power supply terminal. The first input terminal of the amplifier arrangement is also coupled to the input node.

The second resistor couples the second input terminal of the amplifier arrangement to the second power supply terminal. The second transistor couples the first power supply terminal to the second input terminal of the amplifier arrangement. A control terminal of the first transistor and a control terminal of the second transistor are connected to each other and are connected to the output terminal of the amplifier arrangement. The first input terminal of the amplifier arrangement is coupled to the second power supply terminal by a linear coupling. Further on, the second input terminal of the amplifier arrangement is coupled to the second power supply terminal by a linear coupling. The linear couplings are implemented using the first and the second resistors, which are linear devices.

The first resistor and the second resistor may have approximately the same resistance values. Because the difference in voltages at the first input terminal and the second input terminal of the amplifier arrangement is approximately 0, the voltage drop across the first resistor and the voltage drop across the second resistor have approximately the same value.

The first transistor and the second transistor may have approximately the same voltage/current-characteristics. Since the voltages at the control terminals of the first and second transistors are approximately equal, and since a voltage drop across a controlled section of the first transistor and a voltage drop across a controlled section of the second transistor are also approximately equal, the current flowing through the first current path is approximately equal to the converted current flowing through the second current path. If the ramp voltage changes its value at the input node in the first current path, a voltage at the first input terminal of the amplifier arrangement also changes its value. The amplifier arrangement, therefore, also changes the value of the output signal to achieve a difference voltage of approximately 0 between the two input terminals of the amplifier arrangement. This causes a change of the converted current and of the current flowing in the first current path until the ramp voltage equals the voltage at the first input terminal of the amplifier arrangement.

In an embodiment, the voltage/current converter circuit comprises a third resistor. The third resistor is arranged in the first current path between the first resistor and the first transistor. The third resistor couples the first input terminal of the amplifier arrangement to the input node. The first resistor, the third resistor, and the first transistor are connected in series. A first terminal of the third resistor is connected to the first resistor and to the first input terminal of the amplifier arrangement. A second terminal of the third resistor is connected to the input node of the first current path. A greater value of a voltage applied to the first input terminal of the amplifier arrangement can be chosen because of the voltage drop across the third resistor. A current flowing through the first current path is approximately equal to $$I2 = \frac{VDD - Vramp}{R1 + R3},$$

where I2 is the current flowing through the first current path, VDD is a voltage at the second power supply terminal, Vramp is the ramp voltage, R1 is a resistance value of the first resistor, and R3 is a resistance value of the third resistor. Because of the third resistor, a low value of the voltage at the second power supply terminal is sufficient for operation of the amplifier arrangement, even for low and for high values of the ramp voltage.

In an embodiment, the voltage/current converter circuit is implemented as a two-port network comprising the input node as an input and the output terminal of the amplifier arrangement as an output.

In an embodiment, a ramp generator circuit comprises the voltage/current converter. In an embodiment, the ramp generator circuit further comprises a voltage ramp circuit which is coupled to the voltage/current converter circuit.

In an embodiment, the voltage ramp circuit comprises a capacitor and a transistor. The capacitor and the transistor are series connected between the first and the second power supply terminals. A node between the capacitor and the transistor is connected to the input node of the first current path of the voltage/current converter circuit. An additional transistor is coupled to the capacitor in such a way that a first terminal of the additional transistor is connected to a first terminal of the capacitor and a second terminal of the additional transistor is connected to a second terminal of the capacitor. An inverted clock signal is applied to a control terminal of the additional transistor. Therefore, the capacitor is short circuited when the inverted clock signal switches the additional transistor to an onstate. After short circuiting of the capacitor, the transistor provides a current to the capacitor so that a ramp voltage is provided at the node between the capacitor and the transistor.

The transistor that is serially connected to the capacitor may be coupled to a further transistor to form a current mirror. Therefore, current that is provided by the transistor to the capacitor can be kept approximately constant by the use of the current mirror.

In an embodiment, the amplifier arrangement is implemented as an amplifier with low supply voltages, high gain factor, and low offset value.

In an embodiment, the ramp generator circuit comprises circuitry to generate a ramp current. The ramp current is approximately equal to a converted current that flows in the second current path. The circuitry to generate a ramp current is implemented as a current mirror. The current mirror comprises the second transistor and a third transistor.

In an embodiment, a ramp generator circuit comprises a current comparator that is coupled to the circuitry to generate a ramp current. The third transistor is part of the circuitry to generate a ramp current and is also part of the current comparator. The ramp current provided to the current comparator through the use of the third transistor is approximately equivalent to the converted current that flows in the second current path.

In an embodiment, the current comparator comprises a fifth transistor for providing a reference current. A terminal of the third transistor and a terminal of the fifth transistor are connected together and are connected to an input terminal of a first inverter. If the reference current has a greater value than the ramp current, a signal provided to the input terminal of the first inverter has a high voltage value and, therefore, a clock signal provided at the output terminal of the first inverter is in a low-state. If the reference current has a smaller value than the ramp current, the clock signal is in a high-state.

In an embodiment, the ramp generator circuit comprises a second inverter with an input terminal that is connected to an output terminal of the first inverter. The second inverter provides the inverted clock signal at an output terminal of the second inverter.

In an embodiment, the ramp generator circuit is implemented using a semiconductor body. The transistors may be implemented as metal-oxide-semiconductor field-effect transistors.

In an embodiment, a method for providing a ramp current comprises the following. A ramp voltage is received at an input node of a voltage/current converter circuit. The voltage/current converter circuit is configured in a bridge. The ramp voltage is converted into a current flowing through a first current path. The first current path comprises the input node. The bridge configuration of the voltage/current converter circuit is balanced; therefore, the current in the first current path is approximately equal to a converted current flowing in a second current path. A ramp current is provided, which depends on the converted current by a second current mirror. The method reduces the amount of effort required to convert a ramp voltage into a corresponding ramp current.

In an embodiment, the bridge configuration of the voltage/current converter circuit is balanced by an amplifier arrangement.

In an embodiment, a voltage drop is provided in the first current path via a third resistor which couples the input node to a first input terminal of the amplifier arrangement.

The ramp voltage may be generated in a sawtooth form.

The following describes embodiments. Like reference numerals refer to like elements in different figures. A description of a part of a circuit or a device having the same function in different figures might not be repeated in every of the following figures.

DETAILED DESCRIPTION

Figure 1:
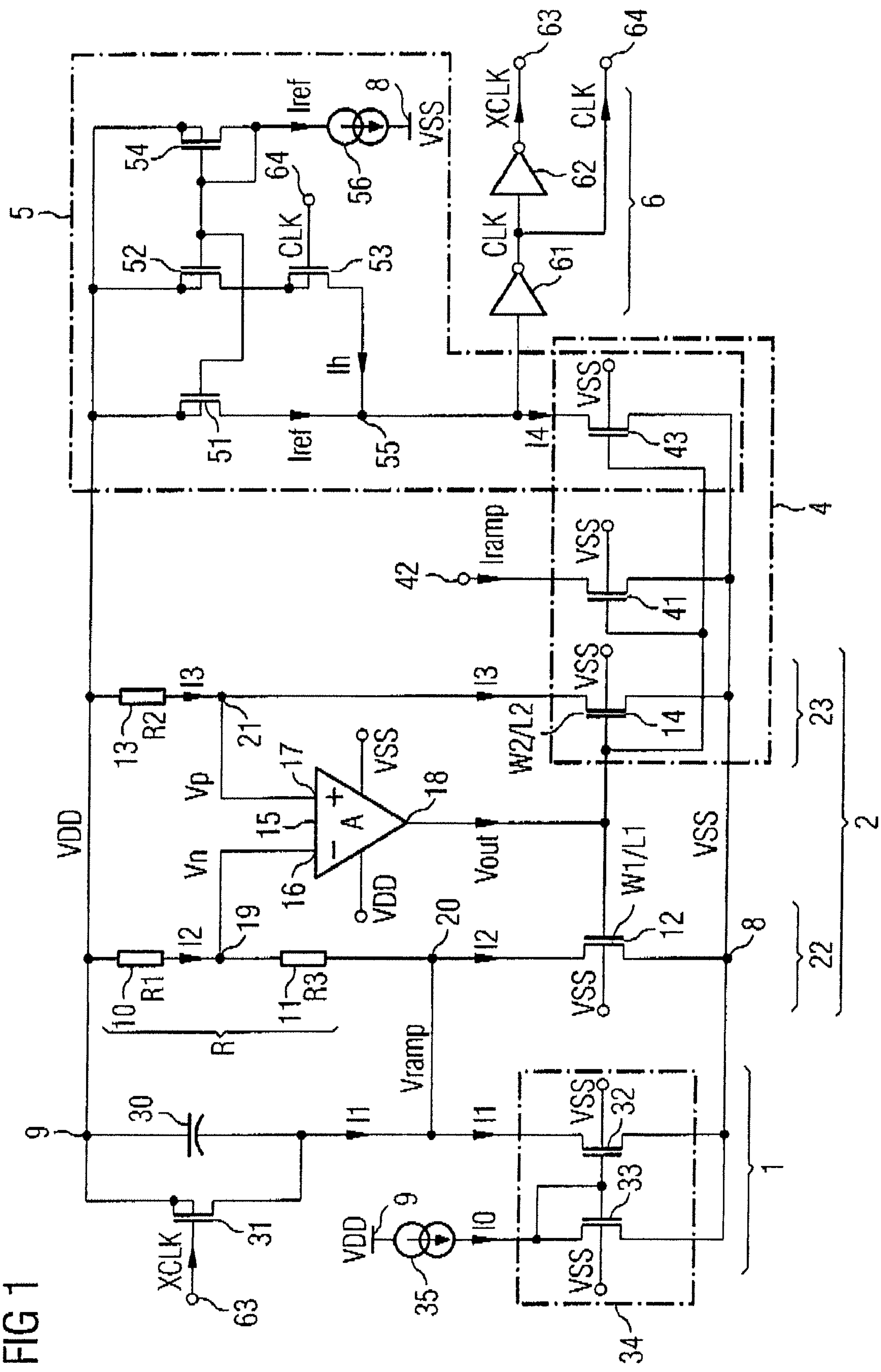
FIG. 1 shows a schematic of an embodiment of ramp generator circuit.

FIG. 1 shows an embodiment of a ramp generator circuit. The ramp generator circuit comprises a voltage ramp circuit 1, a voltage/current converter circuit 2, circuitry to generate a ramp current 4, a current comparator 5, and a clock generator 6. The voltage ramp circuit 1 comprises a capacitor 30, a first current mirror 34, an additional transistor 31, and a current source 35. The capacitor 30 and the first current mirror 34 are series connected between a first power supply terminal 8 and a second power supply terminal 9. A first terminal of the capacitor 30 and a first terminal of the additional transistor 31 are connected to the second power supply terminal 9. A second terminal of the capacitor 30 and a second terminal of the additional transistor 31 are connected together and are connected to the first current mirror 34. The first current mirror 34 comprises two transistors 32, 33 with control terminals that are connected together and first terminals that are connected to the first power supply terminal 8. A second terminal of the transistor 32 is connected to the second terminal of the capacitor 30. A second terminal of the further transistor 33 is connected to the control terminal of the further transistor 33 and to the current source 35. The current source 35 is implemented via a bandgap reference circuit.

The voltage/current converter circuit 2 is connected to a node between the first current mirror 34 and the capacitor 30. The voltage/current converter circuit 2 comprises a first and a second current path 22, 23. The first current path 22 comprises a first and a third resistor 10, 11 and a first transistor 12 that are series connected. This series circuit is connected between the first power supply terminal 8 and the second power supply terminal 9. Further on, the first current path 22 comprises an input node 20. The input node 20 is coupled to the first power supply terminal 8 via the first transistor 12. The second current path 23 comprises a second resistor 13 and a second transistor 14. The voltage/current converter circuit 2 further comprises an amplifier arrangement 15 having a first input terminal 16, which is connected to a node 19 between the first and the third resistor 10, 11 in the first current path 22. The input node 20 is coupled to the node 19 via the third resistor 11. Furthermore, the input node 20 is coupled to the second power supply terminal 9 via the first and the third resistors 10, 11. In an analogous manner, a second input terminal 17 of the amplifier arrangement 15 is connected to a node 21 between the second resistor 13 and the second transistor 14. An output terminal 18 of the amplifier arrangement 15 is coupled to a control terminal of the first transistor 12 and to a control terminal of the second transistor 14.

The circuitry to generate a ramp current 4 is connected to the voltage/current converter circuit 2. The circuitry to generate a ramp current 4 comprises the second transistor 14, a fourth transistor 41 and a third transistor 43 which are connected together at their control terminals. A first terminal of the second transistor 14, the fourth transistor 41 and the third transistor 43 are connected together and are connected to the first power supply terminal 8.

The ramp generator circuit further comprises the current comparator 5. The current comparator 5 comprises the third, a fifth, a sixth, a seventh, and an eighth transistor 43, 51 to 54. The current comparator 5 further comprises a current source 56 and a first inverter 61. An input terminal of the first inverter 61 is coupled to the first power supply terminal 8 via the third transistor 43 and to the second power supply terminal 9 via the fifth transistor 51. The input terminal of the first inverter 61 is also coupled to the second power supply terminal 9 by a serial circuit of the sixth and the seventh transistor 52, 53. The eighth transistor 54 is connected to the second power supply terminal 9 and coupled via the current source 56 to the first power supply terminal 8. A control terminal of the eighth transistor 54 is connected to a node between the eighth transistor 54 and the current source 56 and is also connected to a control terminal of the fifth and the sixth transistor 51, 52. The fifth, the sixth, and the eighth transistor 51, 52, 54 are, therefore, connected to implement a third current mirror. The current source 56 is implemented using a bandgap reference circuit.

The clock generator 6 comprises the first inverter 61, a second inverter 62 which is coupled to an output terminal of the first inverter 61 and two output terminals 63, 64. The output terminal 63 is connected to an output terminal of the second inverter 62 and the output terminal 64 is connected to the output terminal of the first inverter 61.

The additional transistor 31 of the voltage ramp circuit 1 is controlled by an inverted clock signal XCLK and provides a short circuit of the two terminals of the capacitor 30 in a first state of the ramp generator circuit. In a second state of the ramp generator circuit, the additional transistor 31 of the voltage ramp circuit 1 is in an open state. In the beginning of the second state, both terminals of the capacitor 30 are approximately at a voltage VDD provided at the second power supply terminal 9. The current source 35 of the voltage ramp circuit 1 provides a current I0 to the first current mirror 34. Because a current I1 is flowing through the transistor 32 of the first current mirror 34, a ramp voltage Vramp at a node between the capacitor 30 and the first current mirror 34 decreases linearly.

Because the node between the capacitor 30 and the first current mirror 34 is connected to the input node 20 of the first current path 22 of the voltage/current converter circuit 2, the current I2 that flows in the first current path 22 increases. Therefore, a voltage Vn at the first input terminal 16 of the amplifier arrangement 15 also decreases. Therefore, an output signal Vout of the amplifier arrangement 15 increases, so that the current I2 through the first transistor 12 also increases. Because of the increased output signal Vout, the converted current I3 flowing through the second transistor 14 increases. The converted current I3 also flows through the second resistor 13. As a result, a decreased value of a voltage Vp is applied to the second input terminal 17 of the amplifier arrangement 15. The second resistor 13 and the first resistor 10 have approximately the same resistance value. The first transistor 12 has a first width-to-length ratio W1/L1 and the second transistor 14 has a W2/L2 second width-to-length ratio that is approximately equal to the first width-to-length ratio W1/L1. Therefore, the current flowing through the first and second transistor 12, 14 and through the first and the second resistor 10, 13 have approximately the same current value. Therefore, a current flowing from the node between the capacitor 30 and the first current mirror 34 to the input node 20 has approximately the value 0 or has a very small current value. A decreasing value of the ramp voltage VRAMP results in an increasing converted current I3.

The circuitry to generate a ramp current 4 comprising a second current mirror is used for coupling the current comparator 5 to the voltage/current converter 2. The ramp current I4, the ramp current Iramp, and the converted current I3 have approximately the same current value. At the beginning of the second state, the ramp current I4 is small. A reference current Iref is provided by the fifth transistor 51. An additional reference current Ih is provided by the series circuit of the sixth and the seventh transistor 52, 53 of the third current mirror. A sum of the reference current Iref and of the additional reference current Ih has a greater value than the ramp current. Therefore, a voltage at the input terminal of the first inverter 61 is high and a clock signal CLK, which is provided at an output terminal of the first inverter 61, is in a low-state. The clock signal CLK is also provided at the output terminal 64. An inverted clock signal XCLK is provided at the output terminal of the second inverter 62 and, therefore, also provided at an output terminal 63 of the ramp generator circuit and is in a high-state. When the ramp voltage Vramp decreases and, therefore, the ramp current I4 increases, the ramp current I4 obtains a greater value relative to the reference current Iref, so that the voltage at the input terminal of the first inverter 61 will rise and, therefore, the clock signal CLK obtains a high-state. The inverted clock signal XCLK will therefore be in a low-state, so that the additional transistor 31 turns on and the capacitor 30 is discharged.

A control terminal of the seventh transistor 53 is connected to the output terminal 64 and, therefore, to the output terminal of the first inverter 61. The sixth and the seventh transistors 52, 53 provide the additional reference current Ih, which will be added to the reference current Iref, when the clock signal CLK obtains a low-state.

The voltage VDD at the second power supply terminal 9 is higher than a voltage VSS at the first power supply terminal 8. The transistors 33, 32 of the first current mirror 34, the first, the second, the third and the fourth transistor 12, 14, 41, 43 are implemented as N-channel field-effect transistors. The additional transistor 31 of the voltage ramp circuit 1 and the transistors 51, 52, 53, 54 of the current comparator 5 are implemented as P-channel field-effect transistors. The transistors are designed as metal-oxide-semiconductor field-effect transistors.

The additional reference current Ih provides a hysteresis to the current comparator 5. By virtue of the ramp generator circuit, the ramp voltage Vramp decreases linearly and, therefore, the ramp current I4 decreases linearly.

In an alternative embodiment, the first width-to-length ratio W1/L1 and the second width-to-length ratio W2/L2 are not equal, and the first resistor 10 and the second resistor 13 do not have equal values. A ratio of the first resistor 10 to the second resistor 13 is approximately equal to a ratio of the second width-to-length ratio W2/L2 to the first width-to-length ratio W1/L1. Therefore, the converted current I3 flowing through the second transistor 14 and the second resistor 13 is not equal to the current I2 flowing through the first transistor 12 and the first resistor 10. A ratio of the converted current I3 to the current I2 is approximately equal to the ratio of the first resistor 10 to the second resistor 13.

Figure 2:
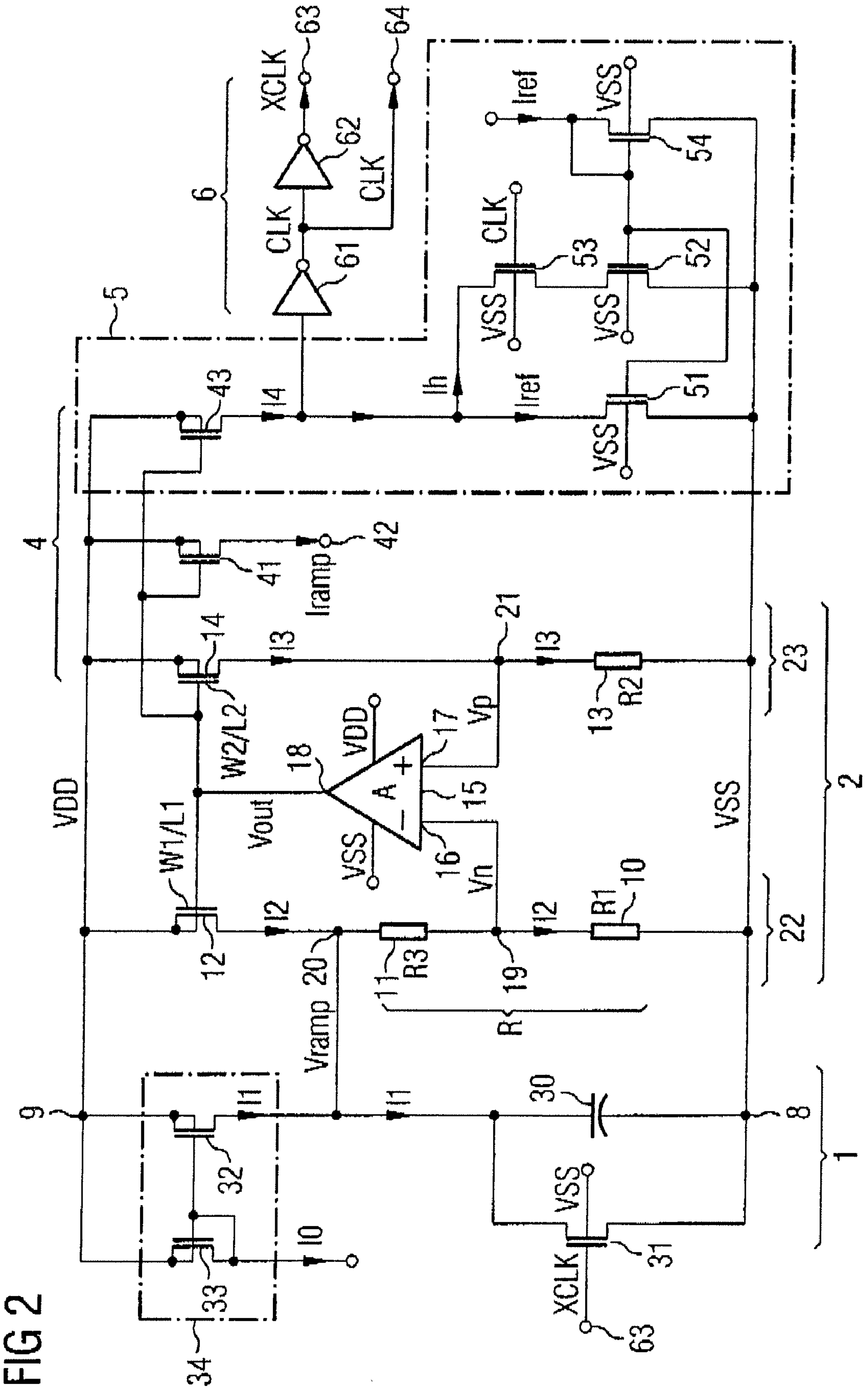
FIG. 2 shows a schematic of an alternative embodiment of a ramp generator circuit.

FIG. 2 shows an alternative embodiment of a ramp generator circuit. In the circuit according FIG. 2, the voltage VDD at the second power supply terminal 9 is higher than the voltage VSS at the first power supply terminal 8. The schematic of the ramp generator circuit according to FIG. 2 is designed in an analogous manner to the ramp generator circuit shown in FIG. 1. In this ramp generator circuit, the transistors 33, 32 of the first current mirror 34, the first, the second, the third and the fourth transistor 12, 14, 41, 43 are implemented as P-channel field-effect transistors, while the additional transistor 31 of the voltage ramp circuit 1 and the fifth, the sixth, the seventh, and the eighth transistor 51, 52, 53, 54 are implemented as N-channel field-effect transistors.

Figure 3:
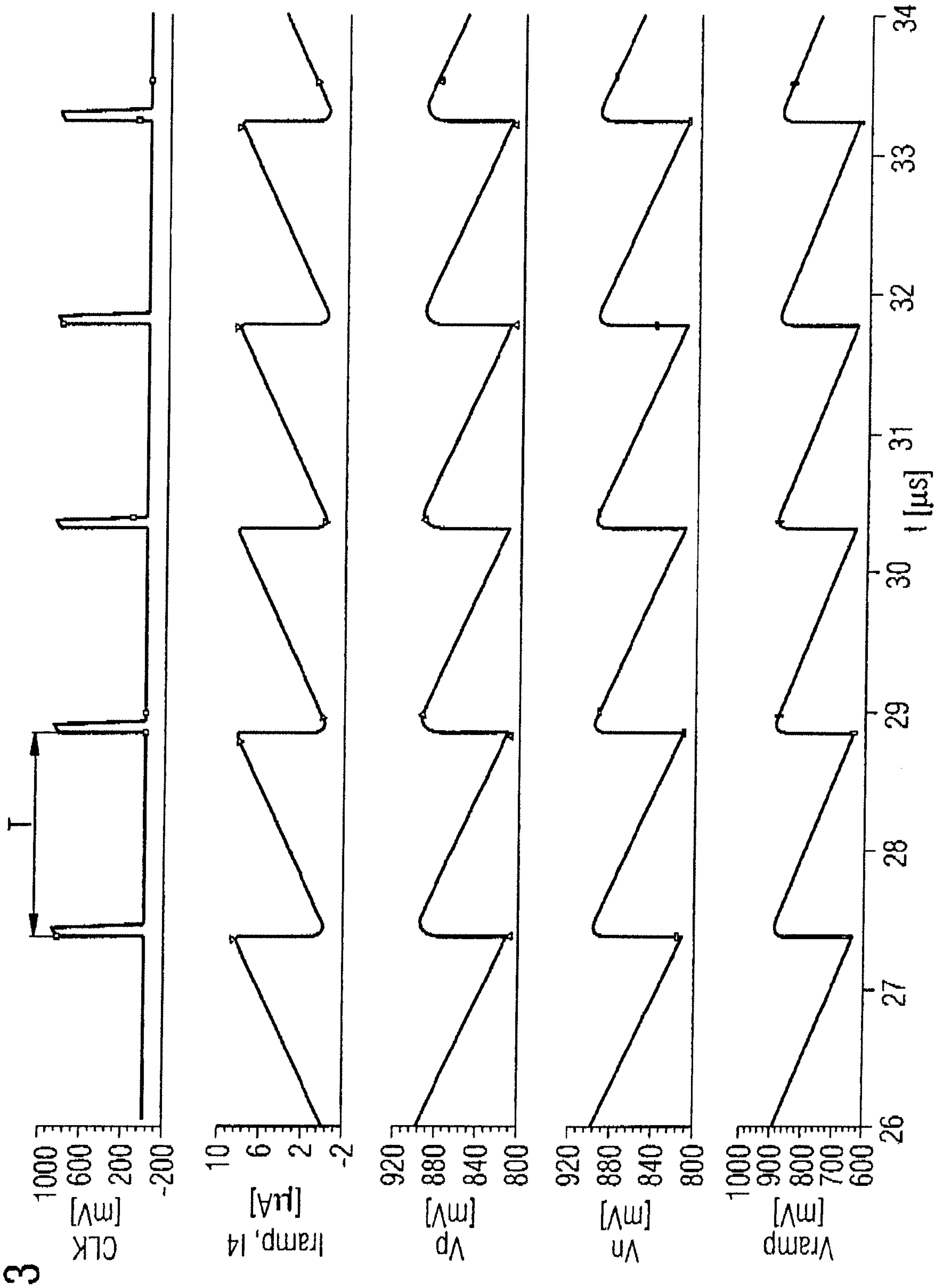
FIG. 3 shows examples of signals in a ramp generator circuit.

FIG. 3 shows an embodiment of signals generated in the ramp generator circuit according to FIG. 1. The clock signal CLK, the ramp current Iramp, I4, the voltage Vp at the second input terminal 17 of the amplifier arrangement 15, the voltage Vn at the first input terminal 16 of the amplifier arrangement 15 and the ramp voltage Vramp are shown versus the time t. The clock signal CLK reaches a high-state for a short time duration only. During this time, the inverted clock signal XCLK is in a low-state and, therefore, during this time, the additional transistor 31 of the voltage ramp circuit 1 provides a short circuit or a low resistance path for the voltage across the two terminals of the capacitor 30. During this state, the capacitor 30 discharges. Both terminals of the capacitor 30 are approximately at the voltage VDD, therefore, the ramp voltage Vramp starts at a high value after the discharge of the capacitor 30. After that, the ramp voltage Vramp decreases and, correspondingly, the voltage Vn and the voltage Vp also decrease. The voltage/current converter 2 provides a ramp current Iramp, I4, which increases while the ramp voltage Vramp decreases. Because the current I1 is smaller than the current flowing through the transistor 31 of the voltage ramp circuit 1, a time duration during which the clock signal CLK is in a low-state is larger than a time duration during which the clock signal CLK is in a high-state. The frequency of the clock signal CLK of the ramp generator is, therefore, approximated by the following equation:

$$framp = \frac{1}{T} = \frac{I1}{C30 \cdot \Delta Vramp},$$

where framp is the frequency of the clock signal CLK, I1 is a value of the current I1 flowing in the voltage ramp circuit 1, C30 is a value of the capacitor 30, and ΔVramp is the difference between the highest and the lowest values of the ramp voltage Vramp and T is the duration of a clock cycle. The equation neglects the time duration in which the clock signal CLK obtains a high-state.

In some embodiments, only a small value for the power supply voltage VDD is needed because the ramp generator circuit operates at low voltages.

Resistance values of the first and the second resistor 10, 13 are approximately equal. Therefore, noise influence of the first and the second resistors 10, 13 is almost equal. As a result, the amplifier arrangement 15 receives a common mode noise, which can be filtered out, and which is not transmitted to the first and the second transistors 12, 14.

A sufficient value for the power supply voltage VDD can be calculated according to the following equation:

$$VDD \geq Vc \cdot \frac{R1}{R1 + R3} + Vgsn + Vdsp,$$

where VDD is a value of the power supply voltage VDD, Vc is a peak voltage across the capacitor 30, R1 is a resistance value of the first resistor 10, R3 is a resistance value of the third resistor 11, Vgsn is a gate source voltage of an n-channel field-effect transistor, and VDSP is a drain source voltage of a p-channel field-effect transistor. The n-channel and the p-channel field-effect transistors comprise the amplifier arrangement 15. The sum of the values of the voltages Vgsn and Vdsp is the minimum voltage at the input of the amplifier arrangement 15.

Figure 4:
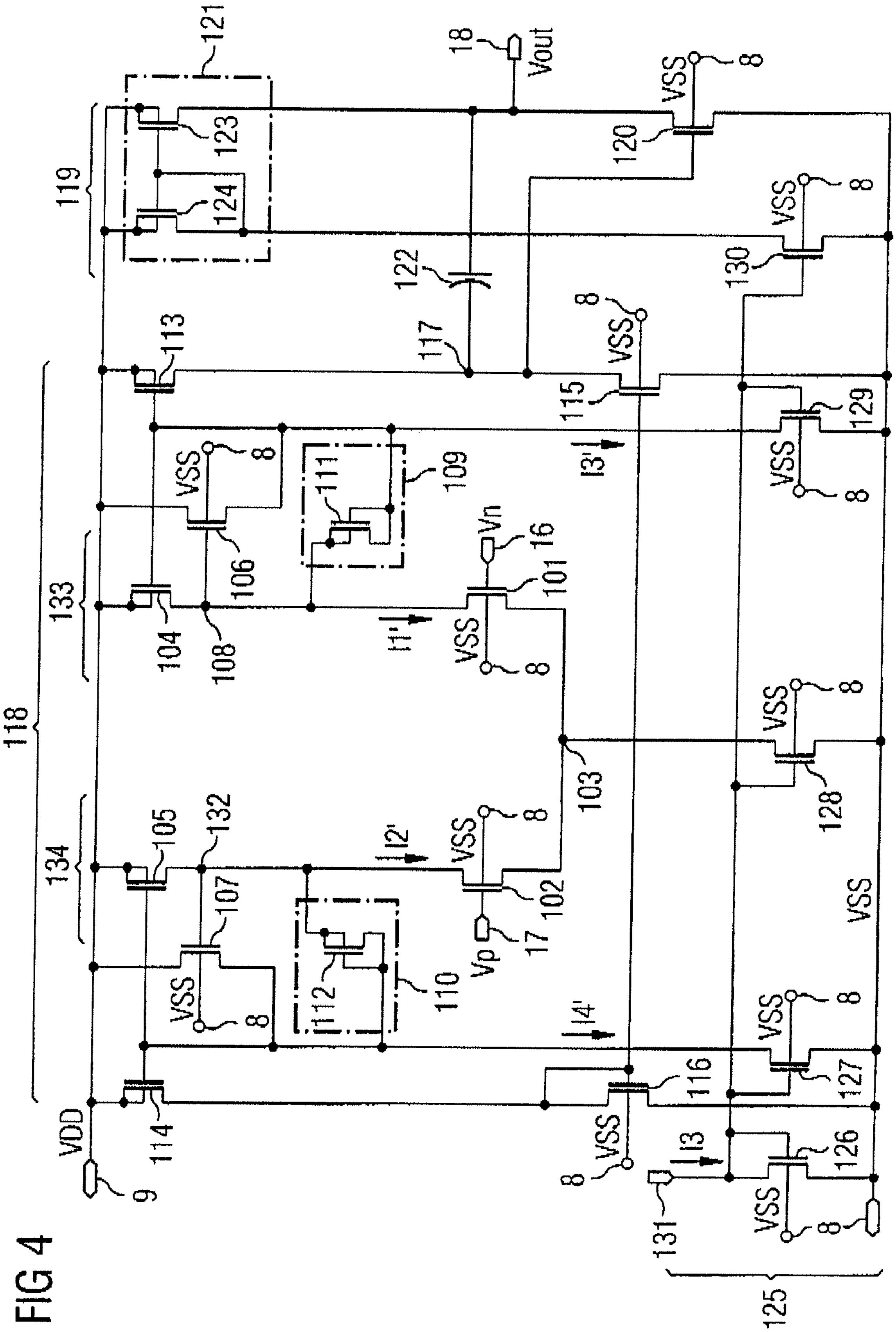
FIG. 4 shows a schematic of an embodiment of an amplifier arrangement.

FIG. 4 shows an embodiment of an amplifier arrangement 15 that can be inserted in the ramp generator circuit shown in FIG. 1. The amplifier arrangement 15 comprises a first and a second transistor 101, 102 with first terminals which are connected to a node 103, which is coupled to the first power supply terminal 8. A first and a second bias transistor 104, 105 of the amplifier arrangement 15 comprise first terminals, which are connected to the second power supply terminal 9. A second terminal of the first bias transistor 104 is connected to a second terminal of the first transistor 101 via a first node 108 and a second terminal of the second bias transistor 105 is connected to a second terminal of the second transistor 102 via a second node 132. The amplifier arrangement 15 comprises a first and a second field-effect transistor 106, 107 with second terminals, which are connected to the second power supply terminal 9. A control terminal of the first field-effect transistor 106 is connected to the first node 108. A first terminal of the first field-effect transistor 106 is connected to a control terminal of the first bias transistor 104. In an analogous manner, a control terminal of the second field-effect transistor 107 is connected to the second node 132. A first terminal of the second field-effect transistor 107 is connected to a control terminal of the second bias transistor 105.

A first resistor 109 of the amplifier arrangement 15 couples the first node 108 to the first terminal of the first field-effect transistor 106. A second resistor 110 of the amplifier arrangement 15 couples the second node 132 to the first terminal of the second field-effect transistor 107. The first and the second resistors 109, 110 are implemented as a first and a second coupling transistor 111, 112.

A third and a fourth bias transistor 113, 114 of the amplifier arrangement 15 each comprise a respective first terminal which is connected to the second power supply terminal 9. A control terminal of the third bias transistor 113 is connected to the control terminal of the first bias transistor 104. In an analogous manner, a control terminal of the fourth bias transistor 114 is connected to the control terminal of the third bias transistor 105. A third and a fourth transistor 115, 116 of the amplifier arrangement 15 each comprises a respective first terminal, which is connected to the first power supply terminal 8. A second terminal of the third transistor 115 is connected to a second terminal of the third bias transistor 113. In a corresponding manner, a second terminal of the fourth transistor 116 is connected to a second terminal of the fourth bias transistor 114. A control terminal of the third transistor 115 is connected to a control terminal of the fourth transistor 116 and in addition also to the second terminal of the fourth transistor 116, so that a current mirror is achieved. A node 117 between the third transistor 115 and the third bias transistor 113 is an output node of the input stage 118 of the amplifier arrangement 15 comprising the first, the second, the third and the fourth transistors 101, 102, 115, 116, the first and the second field-effect transistors 106, 107 and the first, the second, the third and the fourth bias transistors 104, 105, 113, 114. This node 117 may act also as an output node of the amplifier arrangement 15.

The amplifier arrangement 15 further comprises an output stage 119. The output stage 119 comprises a fifth transistor 120, a current mirror 121, a capacitor 122 and the output terminal 18 of the amplifier arrangement 15. The node 117 is connected to a control terminal of the fifth transistor 120. A first terminal of the fifth transistor 120 is connected to the first power supply terminal 8. A second terminal of the fifth transistor 120 is connected to the output terminal 18 of the amplifier arrangement 15 and also to the current mirror 121. The current mirror 121 couples the second terminal of the fifth transistor 120 to the second power supply terminal 9. The current mirror 121 comprises a fifth and a sixth bias transistor 123, 124 with first terminals which are connected to the second power supply terminal 9. A second terminal of the fifth bias transistor 123 is connected to the second terminal of the fifth transistor 120. A control terminal of the fifth bias transistor 123 is connected to a control terminal of the sixth bias transistor 124 and also to a second terminal of the sixth bias transistor 124. The second terminal of the sixth bias transistor 124 is coupled to the first power supply terminal 8. The capacitor 122 couples the node 117 to the output terminal 18 of the amplifier arrangement 15.

A second mirror 125 of the amplifier arrangement 15 comprises a first, a second, a third, a fourth and a fifth mirror transistor 126-130 with first terminals which are connected to the first power supply terminal 8. The control terminals are connected together and are connected to the second terminal of the first mirror transistor 126 and to a current supply terminal 131. A second terminal of the second mirror transistor 127 is connected to the first terminal of the second field-effect transistor 107, and therefore, also to the control terminals of the second and the fourth bias transistors 105, 114. A second terminal of the third mirror transistor 128 is connected to the node 103 between the first and the second transistor 101, 102. A second terminal of the fourth mirror transistor 129 is connected to the first terminal of the first field-effect transistor 106. A second terminal of the fifth mirror transistor 130 is connected to the first current mirror 121 and, therefore, is connected to the second terminal of the sixth bias transistor 124.

The first input signal Vn is supplied to the first input terminal 16, which is coupled to a control terminal of the first transistor 101. The second input signal Vp is supplied to the second input terminal 17, which is coupled to a control terminal of the second transistor 102. Because the node 103 between the first and the second transistors 101, 102 is coupled to the first power supply terminal 8 via the third mirror transistor 128, the first and the second input signals Vn, Vp are amplified differentially. The first and the second field-effect transistors 106, 107 achieve a small voltage between the first and the second terminals of the first bias transistor 104 and between the first and the second terminals of the second bias transistor 105.

Therefore, a voltage between the first and the second terminals of the first transistor 101, and between the first and the second terminals of the second transistor 102, obtains a high value, yielding a high gain of the amplification of the first and the second input signals Vn, Vp. An amplified signal of the first input signal Vn is applied to the control terminal of the third bias transistor 113 and, therefore, also to the node 117 between the third transistor 115 and the third bias transistor 113. An amplified signal of the second input signal Vp is applied in an analogous manner to the control terminal of the fourth bias transistor 114. Because the third and the fourth transistors 115, 116 are coupled together, the amplified signal of the second input signal Vp also influences a voltage at the node 117. The voltage at the node 117 is amplified by the output stage 119 of the amplifier arrangement 15 using the fifth transistor 120 for amplification. A bias current for the fifth transistor 120 is supplied by the first current mirror 121. An output voltage Vout is provided at the output terminal 18 of the amplifier arrangement 15. The first and the second input signals Vn, Vp are amplified differentially, resulting in a voltage at the node 117. The voltage at the node 117 is not amplified differentially, so that the output voltage Vout of the amplifier arrangement 15 is provided.

The transistors of FIG. 4 may be implemented as field-effect transistors, such as MOSFETs. The second supply voltage VDD is applied at the second power supply terminal 9 and the first supply voltage VSS is provided at the first power supply terminal 8. The second supply voltage VDD is higher than the first supply voltage VSS. The first terminals of the transistors can be implemented as a source terminal of the respective field-effect transistors and, therefore, the second terminals of the transistors can be a drain terminal of the field-effect transistors. The control terminals of the transistors are implemented as gate electrodes of the field-effect transistors. The first, the second, the third, the fourth and the fifth transistors 101, 102, 115, 116, 120 and the mirror transistors 126-130 are implemented as n-channel field-effect transistors. The first, the second, the third, the fourth, the fifth and the sixth bias transistors 104, 105, 113, 114, 123, 124 are implemented as p-channel field-effect transistors. The first and the second coupling transistors 111, 112 are realized as p-channel field-effect transistors.

Using n-channel field-effect transistors for the first and the second transistor 101, 102 is advantageous because the amplification achieved by an n-channel transistor is higher than the amplification achieved by a p-channel field-effect transistor with the same transistor area. The input stage 118 of the amplifier arrangement 15, comprising the first, the second, the third and the fourth transistors 101, 102, 115, 116, is constructed symmetrically, resulting in a low offset value of the amplifier arrangement. The output stage 119 increases the gain of the amplifier arrangement 15.

By virtue of the third resistor 11 in the first current path 22 of the voltage/current converter circuit 2, amplifier arrangement 15 can be supplied by a second power supply voltage VDD having a low value, which results in an energy efficient circuit. The first input signal Vn can be made close to the second power supply voltage VDD by the third resistor 11. A low value of the second power supply voltage VDD can be used even in case of a large difference of the ramp voltage Vramp and the second power supply voltage VDD.

In an embodiment, the second power supply voltage VDD may be approximately as low as the sum of a voltage between the first and the second terminals of the third mirror transistor

128 and of a voltage between the control terminal and the first terminal of the first transistor 101. This can be achieved by the voltage drop across the third resistor 11.

In an embodiment, the amplifier arrangement 15 does not include a first and a second resistor 109, 110 and the first and the second coupling transistor 111, 112.

In an alternative embodiment, the first, the second, the third, the fourth and the fifth transistors 101, 102, 115, 116, 120 and the mirror transistors 126-130 are implemented as p-channel field-effect transistors. The first, the second, the third, the fourth, the fifth and the sixth bias transistors 104, 105, 113, 114, 123, 124 are implemented as n-channel field-effect transistors. The first and the second coupling transistors 111, 112 are implemented as n-channel field-effect transistors. In the alternative embodiment, the first power supply terminal 8 and the second power supply terminal 9 are interchanged in comparison with the amplifier arrangement 15 shown in FIG. 4. The first power supply terminal 8 provides the first power supply voltage VSS and the second power supply terminal 9 provides the second power supply voltage VDD, which has a value which is greater than a value of the first power supply voltage VSS. The amplifier arrangement 15 according to this alternative embodiment can be inserted in the ramp generator circuit of FIG. 2.

Components of different embodiments described herein may be combined to form other embodiments not specifically set forth above. Other embodiments not specifically described herein are also within the scope of the following claims.

What is claimed is:

1. A voltage/current converter circuit comprising:

a bridge configuration comprising:

a first current path comprising a first resistor, a first transistor, and an input node to receive a ramp voltage to be converted;

a second current path to pass a converted current, the second current path comprising a second resistor and a second transistor; and an amplifier arrangement to balance the bridge configuration by providing an output signal to a control terminal of the first transistor and by providing the output signal to a control terminal of the second transistor, the control terminal of the first transistor being connected to the control terminal of the second transistor, the amplifier arrangement comprising:

a first input terminal electrically connected to the first current path; and a second input terminal electrically connected to the second current path; and a third resistor in the first current path between the first resistor and the first transistor, the third resistor being in a circuit path between the first input terminal and the input node, wherein the first resistor, the third resistor, and the first transistor are in series; and wherein:

the first transistor electrically connects the input node to a first power supply terminal;

the first input terminal is electrically connected to a second power supply terminal via the first resistor;

the second input terminal is electrically connected to the second power supply terminal via the second resistor; and the second input terminal is electrically connected to the first power supply terminal via the second transistor.

2. The voltage/current converter circuit of claim 1, wherein the first resistor and the second resistor have resistances that are approximately equal.

3. The voltage/current converter circuit of claim 1, wherein a ratio of a resistance of the first resistor to a resistance of the second resistor is approximately equal to a ratio of a second width-to-length ratio of the second transistor to a first width-to length ratio of the first transistor.

4. A ramp generator circuit comprising:

a voltage/current converter circuit comprising:

a bridge configuration comprising:

a first current path comprising a first resistor, a first transistor, and an input node to receive a ramp voltage to be converted;

a second current path to pass a converted current, the second current path comprising a second resistor and a second transistor; and an amplifier arrangement to balance the bridge configuration by providing an output signal to a control terminal of the first transistor and/or to a control terminal of the second transistor, the amplifier arrangement comprising:

a first input terminal electrically connected to the first current path; and a second input terminal electrically connected to the second current path; and a voltage ramp circuit that is electrically connected to the input node to provide the ramp voltage;

wherein the voltage ramp circuit comprises:

a capacitor that is controllable to periodically charge and discharge; and a current mirror to electrically connect the input node to a first power supply terminal;

wherein the capacitor electrically connects the input node to a second power supply terminal.

5. The ramp generator circuit of claim 4, further comprising:

circuitry to generate a ramp current that is dependent on the current in the second current path, wherein the circuitry is electrically connected to the second current path.

6. The ramp generator circuit of claim 5, wherein the circuitry comprises a first current mirror comprised of the second transistor and a third transistor.

7. The ramp generator circuit of claim 6, wherein the circuitry further comprises:

a fourth transistor; and an additional terminal that is electrically connected to the fourth transistor to provide ramp current that is dependent on the current in the second current path.

8. The ramp generator circuit of claim 6, further comprising:

a current comparator for comparing the ramp current to a reference current, the current comparator comprising:

a fourth transistor; and the third transistor; and an inverter comprising an input terminal that is electrically connected to a first power supply terminal via the third transistor and to a second power supply terminal via the fourth transistor, the inverter comprising an output terminal to provide a clock signal.

9. The ramp generator circuit of claim 8, wherein the current comparator comprises a second current mirror for providing the reference current via the fourth transistor.

10. The ramp generator circuit of claim 9, wherein the second current mirror comprises a fifth transistor and a sixth transistor for periodically providing an additional reference current to the input terminal of the first inverter.

11. The ramp generator circuit of claim 4, further comprising:

circuitry to generate a ramp current that is dependent on the current in the second current path, wherein the circuitry is electrically connected to the second current path.

12. The ramp generator circuit of claim 11, wherein the circuitry comprises a first current mirror comprised of the second transistor and a third transistor.

13. The ramp generator circuit of claim 12, wherein the circuitry further comprises:

a fourth transistor; and an additional output terminal that is electrically connected to the fourth transistor to provide ramp current that is dependent on the current in the second current path.

14. The ramp generator circuit of claim 4, wherein:

the first transistor electrically connects the input node to a first power supply terminal;

the first input terminal is electrically connected to a second power supply terminal via the first resistor;

the second input terminal is electrically connected to the second power supply terminal via the second resistor; and the second input terminal is electrically connected to the first power supply terminal via the second transistor.

15. The ramp generator circuit of claim 14, wherein the first current path comprises a third resistor between the first resistor and the first transistor, the third resistor being in a circuit path between the first input terminal and the input node.

16. A ramp generator circuit comprising:

a voltage/current converter circuit comprising:

a bridge configuration comprising:

a first current path comprising a first resistor, a first transistor, and an input node to receive a ramp voltage to be converted;

a second current path to pass a converted current, the second current path comprising a second resistor and a second transistor; and an amplifier arrangement to balance the bridge configuration by providing an output signal to a control terminal of the first transistor and/or to a control terminal of the second transistor, the amplifier arrangement comprising:

a first input terminal electrically connected to the first current path; and a second input terminal electrically connected to the second current path;

a voltage ramp circuit that is electrically connected to the input node to provide the ramp voltage; and circuitry to generate a ramp current that is dependent on the current in the second current path;

wherein the circuitry is electrically connected to the second current path.

17. The ramp generator circuit of claim 16, wherein the voltage ramp circuit comprises a capacitor that is controllable to periodically charge and discharge.

18. The ramp generator circuit of claim 16, wherein the voltage ramp circuit comprises:

a current mirror to electrically connect the input node to a first power supply terminal;

wherein a capacitor electrically connects the input node to a second power supply terminal.

19. The ramp generator circuit of claim 16, wherein the first current path comprises a third resistor between the first resistor and the first transistor, the third resistor being in a circuit path between the first input terminal and the input node.

20. A voltage/current converter circuit comprising:

a bridge configuration comprising:

a first current path comprising a first resistor, a first transistor, and an input node to receive a ramp voltage to be converted;

a second current path to pass a converted current, the second current path comprising a second resistor and a second transistor; and an amplifier arrangement to balance the bridge configuration by providing an output signal to a control terminal of the first transistor and by providing the output signal to a control terminal of the second transistor, the control terminal of the first transistor being connected to the control terminal of the second transistor, the amplifier arrangement comprising:

a first input terminal electrically connected to the first current path; and a second input terminal electrically connected to the second current path; and a third resistor in the first current path between the first resistor and the first transistor, the third resistor being in a circuit path between the first input terminal and the input node, wherein the first resistor, the third resistor, and the first transistor are in series;

wherein a ratio of a resistance of the first resistor to a resistance of the second resistor is approximately equal to a ratio of a second width-to-length ratio of the second transistor to a first width-to length ratio of the first transistor.

* * * * *